(12) United States Patent
Goto et al.

(10) Patent No.: US 6,759,841 B2
(45) Date of Patent: Jul. 6, 2004

(54) HALL-EFFECT CURRENT DETECTOR

(75) Inventors: Hirokazu Goto, Tokyo (JP); Koji Ohtsuka, Kawagoe (JP); Takashi Kato, Asaka (JP); Hiromichi Kumakura, Ooimachi (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/172,200

(22) Filed: Jun. 14, 2002

(65) Prior Publication Data

US 2003/0001559 A1 Jan. 2, 2003

(30) Foreign Application Priority Data

Jun. 15, 2001 (JP) ........................................ 2001-182287

(51) Int. Cl.[7] .................... G01R 15/20; G01R 33/07
(52) U.S. Cl. ................................ 324/117 H; 324/251
(58) Field of Search ............................ 324/117 H, 117 R, 324/127, 251, 252; 338/32 H; 327/511; 323/294; 257/425, E43.002

(56) References Cited

U.S. PATENT DOCUMENTS

| | | | | |
|---|---|---|---|---|
| 4,283,643 A | * | 8/1981 | Levin | 327/511 |
| 4,539,520 A | * | 9/1985 | McBride | 324/117 H |
| 5,041,780 A | * | 8/1991 | Rippel | 324/117 H |
| 5,583,429 A | * | 12/1996 | Otaka | 324/127 |
| 6,356,068 B1 | * | 3/2002 | Steiner et al. | 324/117 H |
| 6,414,474 B1 | * | 7/2002 | Gohara et al. | 324/117 H |
| 6,515,468 B1 | * | 2/2003 | Morimoto et al. | 324/117 H |

FOREIGN PATENT DOCUMENTS

JP    2000-174357    6/2000

* cited by examiner

*Primary Examiner*—Ernest Karlsen
(74) *Attorney, Agent, or Firm*—Woodcock Washburn LLP

(57) ABSTRACT

A current detector comprising a Hall generator assembly and a current-path conductor assembly. The Hall generator assembly includes a Hall generator in the form of a semiconductor chip mounted to a metal-made mounting plate via a sheet of magnetic material such as Permalloy. A plastic encapsulation envelops at least parts of all the components of the Hall generator assembly. The current-path conductor assembly includes a sheet-metal current-path conductor and a plastic holder molded in one piece therewith. The Hall generator assembly and the current-path conductor assembly are combined by bonding together the encapsulation of the Hall generator assembly and the conductor holder of the current-path conductor assembly into a unitary casing for the current detector. A covering of Permalloy or the like envelopes the casing.

7 Claims, 16 Drawing Sheets

HALL-EFFECT CURRENT DETECTOR

BACKGROUND OF THE INVENTION

This invention relates to a current detector for detection or measurement of electric current flowing in an electric circuit, and more specifically to such a detector incorporating a Hall-effect device more generally known also as Hall generator.

The Hall generator is built upon the familiar Hall effect to develop a voltage, known as Hall voltage, in proportion to the strength of the magnetic field applied. The Hall generator therefore lends itself to use as a magnetism detector. Additionally, positioned contiguous to a path of electric current, the Hall generator will put out a voltage indicative of the magnitude of the current by being acted upon by the magnetic field appearing in proportion to the current magnitude. The closer the Hall generator is positioned to the current path, the higher will be its sensitivity of current detection.

The instant applicant proposed in Japanese Unexamined Patent Publication No. 2000-174357 a current detector employing a Hal generator. This prior art device was designed explicitly for high detection sensitivity. To this end a current-path conductor layer for the flow of electric current to be detected was laid, via an insulating film, over a semiconductor substrate having a Hall generator formed therein. The prior art device has later proved to be still not totally satisfactory in sensitivity, in noise immunity, in the magnitude of current that can be detected or measured, and in the cost of manufacture.

SUMMARY OF THE INVENTION

The present invention aims at improvement of the sensitivity of the current detector of the kind defined.

Another object of the invention is to improve the noise immunity of the current detector of the kind defined.

Still another object of the invention is to accomplish the foregoing objects in detecting current of much greater magnitude than has so far been possible with the noted prior art with a minimum of performance fluctuations.

Stated in brief, the invention concerns a current detector utilizing the Hall-effect for detection or measurement of electric current, comprising a current-path conductor for carrying current to be detected or measured, a Hall generator disposed opposite the current-path conductor for generating a Hall voltage proportional to the strength of a magnetic field due to the current flowing through the current-path conductor, and a casing of electrically insulating material holding the current-path conductor and the Hall generator in prescribed relative positions. The invention particularly features magnetic layer means disposed opposite the current-path conductor via the Hall generator.

In the preferred embodiments of the invention to be disclosed subsequently, a layer of magnetic material such as a sheet of Permalloy is held against the Hall generator and enveloped in the casing for improvements in immunity to external magnetic or electromagnetic disturbances and in sensitivity to the magnetic field due to the current flowing through the current-path conductor. Additionally, the casing is itself enclosed in a covering of Permalloy or like material. Experiment has proved that such magnetic layer means make substantive contributions toward the higher sensitivity of the current detector, presumably by lessening magnetic resistance to the flux through the Hall generator and by preventing the flux from unnecessarily spreading. Improvements have also been observed in immunity to external magnetic and electromagnetic disturbances.

It is also preferred that the Hall generator, fabricated in the form of a semiconductor chip, be bonded to a metal-made mounting plate via the magnetic layer of Permalloy or the like on the one hand and, on the other hand, held opposite the current-path conductor in very close proximity thereof. This arrangement has proved most conductive to improved sensitivity through reduction of magnetic resistance to the flux acting on the Hall generator The current-path conductor of the current detector according to the invention should preferably be a piece of sheet metal that is slit to provide a U-shaped current path around the Hall generator. The sheet-metal current-path conductor is integrally united with the Hall generator by a casing of plastics or like insulating material. The current detector of this construction is capable of handling current of 100 to 600 amperes.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

Figure 1:
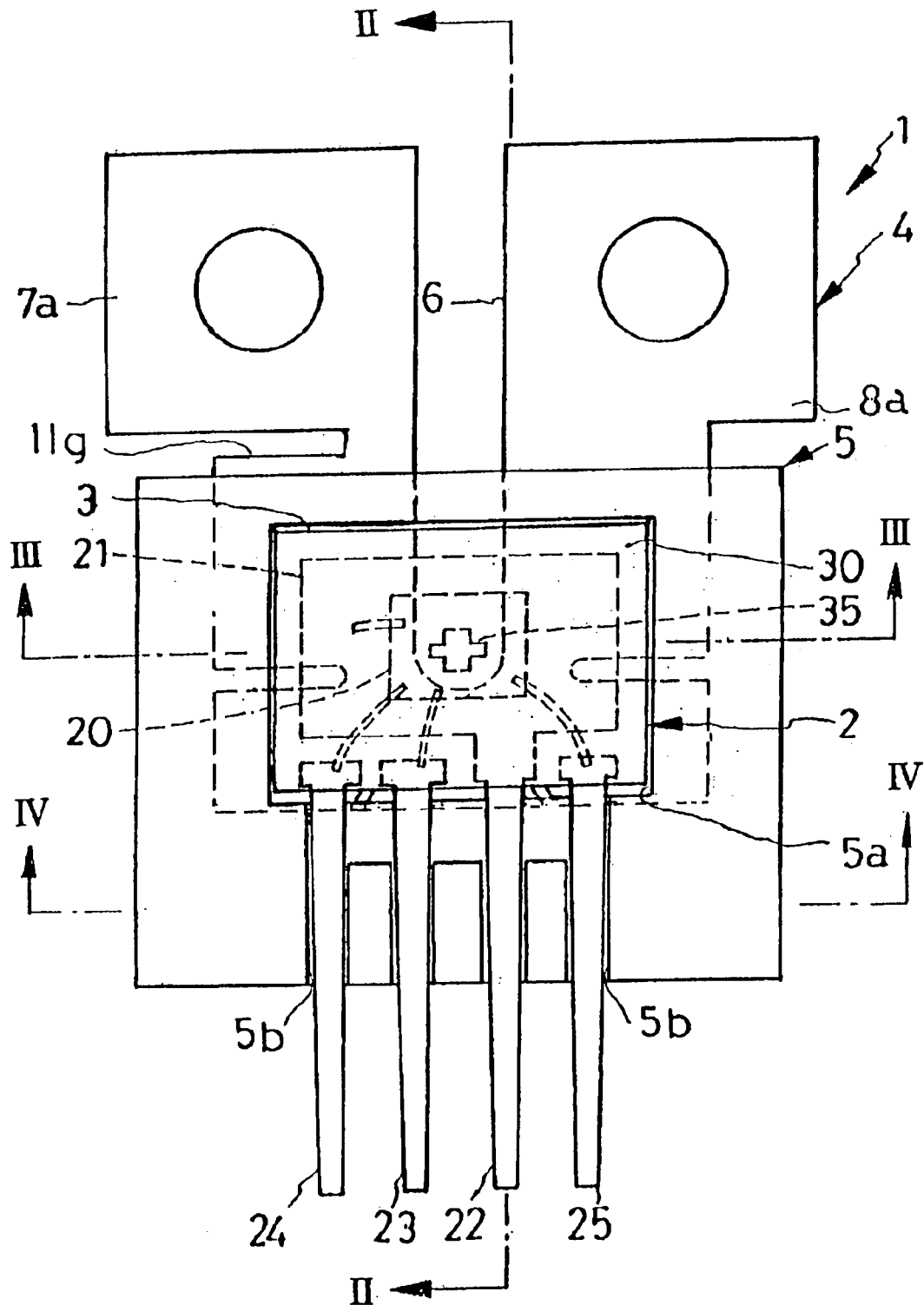
FIG. 1 is a plan view of a first preferred form of current detector according to the present invention.

FIGS. 1–14 of the above drawings are all directed to the first preferred form of current detector according to the invention. Pictured in its entirety and in completed form in FIGS. 1–4, the representative current detector is broadly divisible as in FIG. 5 into a current-path conductor assembly 1 and a Hall generator assembly 2. The two assemblies 1 and 2 are integrally joined together in prescribed positional relationship to each other via an adhesive layer, seen at 3 in both FIGS. 2 and 3, at a final stage of manufacture of this current detector. The current-path conductor assembly 1 provides a path for the current to be detected or measured. The Hall generator assembly 2 includes a semiconductor chip with a Hall-effect element or Hall generator formed therein for generating a Hall voltage proportional to the magnitude of the current flowing through the current path of the current-path conductor assembly 1. The current-path conductor assembly 1 is shown by itself in FIG. 6, and the Hall generator assembly 2 by itself in FIG. 7.

The current-path conductor assembly 1 comprises a sheet-metal current-path conductor 4, which provides the desired current path through the current detector, and a conductor holder 5 of plastics material molded in one piece with the current-path conductor. Preferably, the current-path conductor 4 is a punching of sheet copper, complete with a nickel plating, that is sufficiently thick to carry current of, say, 100 amperes or so.

Figure 8:
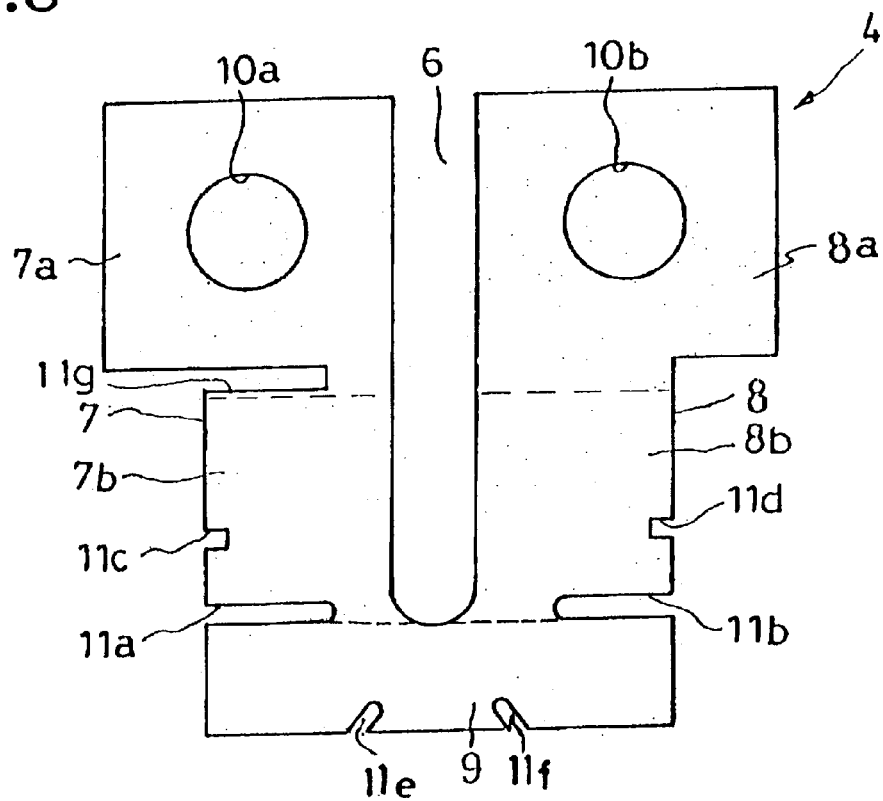
FIG. 8 is a plan view of the current-path conductor of the current-path conductor assembly of FIG. 6.

As best pictured in FIG. 8, the current-path conductor 4 is generally U-shaped in this particular embodiment as a relatively wide and deep slit 6 is cut therein, providing a pair of limbs 7 and 8 extending in parallel spaced relationship to each other, and a bight 9 joining the limbs each at one end thereof. The conductor limbs 7 and 8 are notionally subdivisible, as indicated by the broken lines in FIG. 8, into relatively enlarged distal or terminal portions $7_a$ and $8_a$, and current-path portions $7_b$ and $8_b$ through which the terminal portions are joined to the bight 9, another current-path portion. The terminal portions $7_a$ and $8_a$ of the conductor limbs 7 and 8 have bores $10_a$ and $10_b$ formed therein for use in fastening this current detector to a desired electric circuit to be tested.

The current-path portions $7_b$ and $8_b$ of the conductor limbs 7 and 8 are shown to have a pair of slits $11_a$ and $11_b$, and another pair of shorter slits $11_c$, and $11_d$, respectively, which are cut inwardly (i.e. toward the slit 6) from their outer edges. Still another pair of slits $11_e$ and $11_f$ are shown formed in the bight 9 of the current-path conductor 4. All these pairs of slits are intended to constrict the current path toward the slit 6 and, in consequence, toward the Hall generator which is to be positioned in register with the slit 6, as will be detailed presently. Besides, in insert-molding the plastic holder 5 with the current-path conductor 4, the slit pairs will help realize firmer engagement of the conductor with the conductor holder, resulting in greater mechanical strength of the current-path conductor assembly 1.

An additional slit $11_g$ is shown formed at the boundary between the terminal portion $7_a$ and current-path portion $7_b$ of the conductor limb 7. Unlike the other limbs $11_a$–$11_f$ this slit $11_g$ is intended to make the current-path conductor 4 fusible on carrying a particular value of overload current.

Referring back to FIGS. 5 and 6 in particular, the conductor holder 5 is designed for mechanically supporting and electrically insulating the current-path conductor 4, as well as, no less importantly, for positioning the Hall generator assembly 2 with respect to the conductor 4 in putting together the current-path conductor assembly 1 and Hall generator assembly 2. The conductor holder 5 envelopes part of the current-path conductor 4, leaving exposed all of the pair of terminal portions $7_a$ and $8_a$ and parts of the pair of current-path portions $7_b$ and $8_b$ and the bight 9. More specifically, as will be seen also from FIGS. 2 and 3, the conductor holder 5 covers nearly the complete bottom surfaces, as seen in these figures, and parts of the top surfaces, of the pair of current-path portions $7_b$ and $8_b$ and the bight 9, and fills part of the slit 6 between the pair of conductor limbs 7 and 8 and all of the slits $11_a$–$11_f$.

As indicated in all of FIGS. 1–6, moreover, the conductor holder 5 has formed therein recesses or depressions $5_a$ and $5_b$ for receiving the Hall generator assembly 2 in prescribed positional relationship to the current-path conductor 4. More will be said presently about these positioning recesses $5_a$ and $5_b$. It will be noted from FIGS. 2, 3 and 5 that the conductor holder 5 is rendered thinner at its portion underlying the current-path conductor 4 than at its portion overlying the same. The thinner portion of the conductor holder 5 is intended for greater heat dissipation. The conductor holder 5 of this shape can be easily formed in one piece with the current-path conductor 4 by the familiar transfer molding method or by injection.

Figure 7:
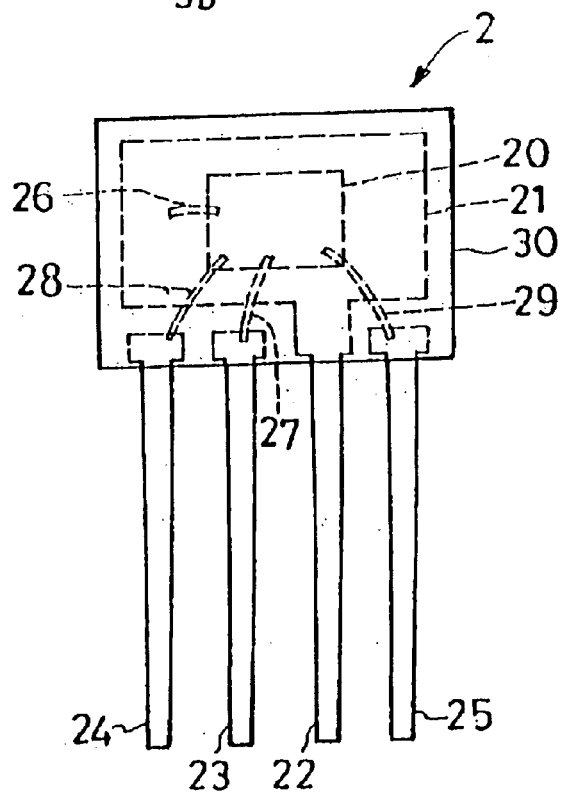
FIG. 7 is a plan view of the Hall generator assembly shown in FIG. 5.

With particular reference to FIG. 7 the Hall generator assembly 2 comprises a semiconductor chip 20 including a Hall generator or Hall-effect device, not shown in this figure, a metal-made mounting plate 21 to which the semiconductor chip is mounted via a layer 91 of magnetic material, a lead 22 of one-piece construction with the mounting plate, three other leads 23, 24 and 25, and a plastic encapsulation 30 enveloping all of the semiconductor chip 20, mounting plate 21, magnetic layer 91, and all but most parts of the leads 22–25. The semiconductor chip 20 is of such design (to be detailed later with reference to FIGS. 12–14) that the Hall generator assembly 2 has the four leads 22–25. Of these, only the lead 22 is electrically coupled to the mounting plate 21 and thence to the semiconductor chip by a wire 26 of aluminum or like material, as will be seen also from FIG. 9 which shows the Hall generator assembly minus the encapsulation 30. The other leads 23–25 are all connected directly to the semiconductor chip by way of wires 27, 28 and 29, respectively.

Figure 4:
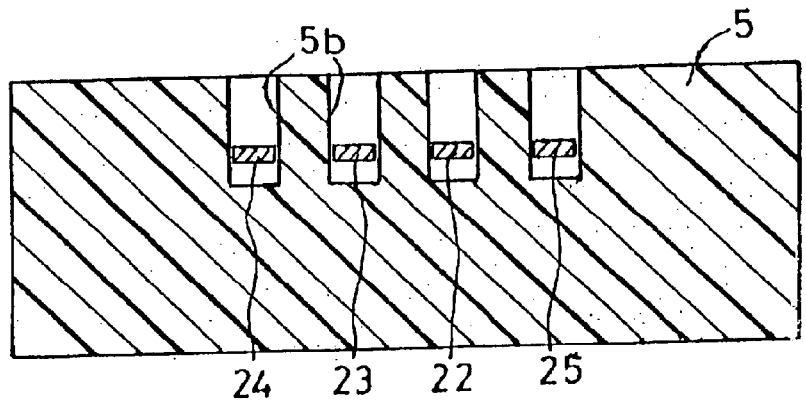
FIG. 4 is still another section through the first preferred form of current detector, taken along the line IV—IV in FIG. 1.
Figure 5:
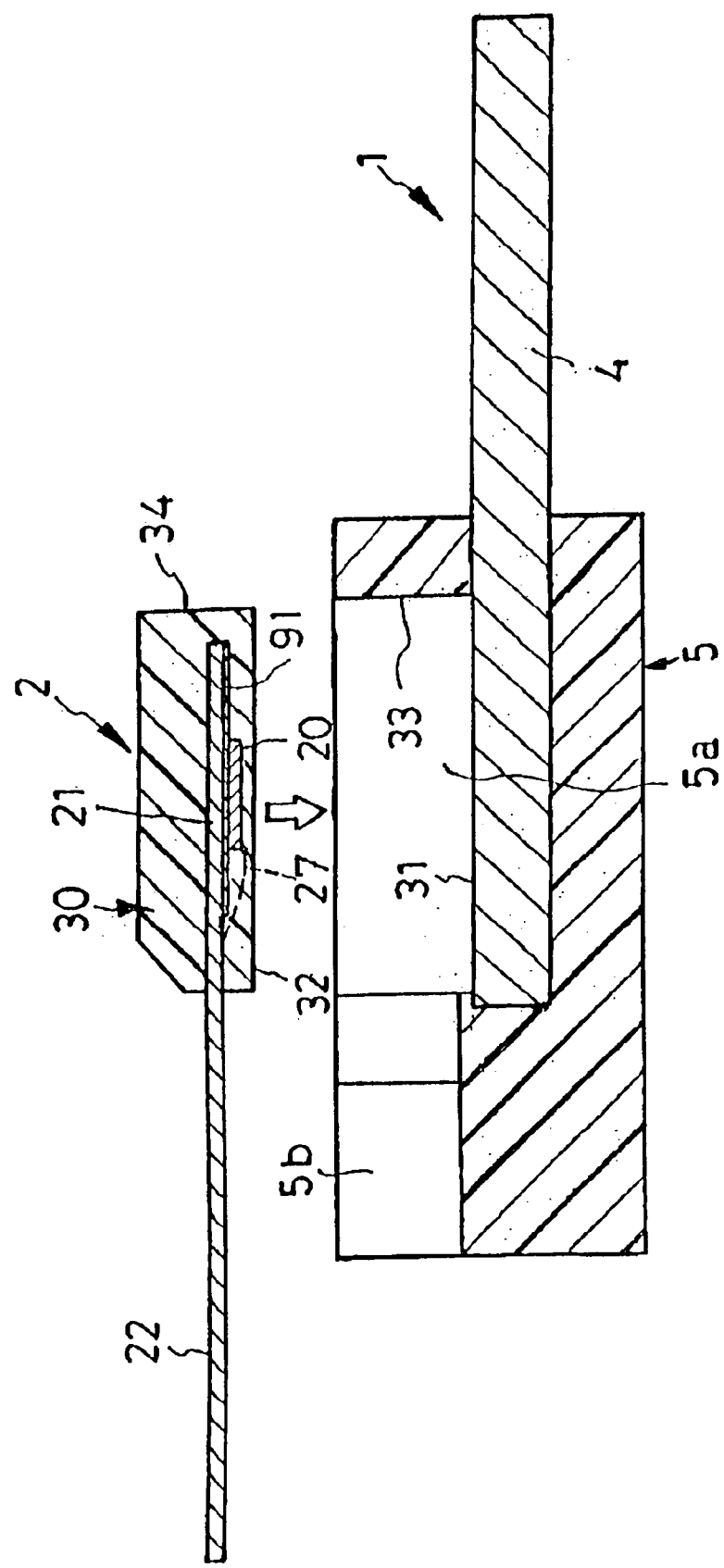
FIG. 5 is a view similar to FIG. 2 except that the current detector is shown divided into a Hall generator assembly and a current-path conductor assembly.
Figure 6:
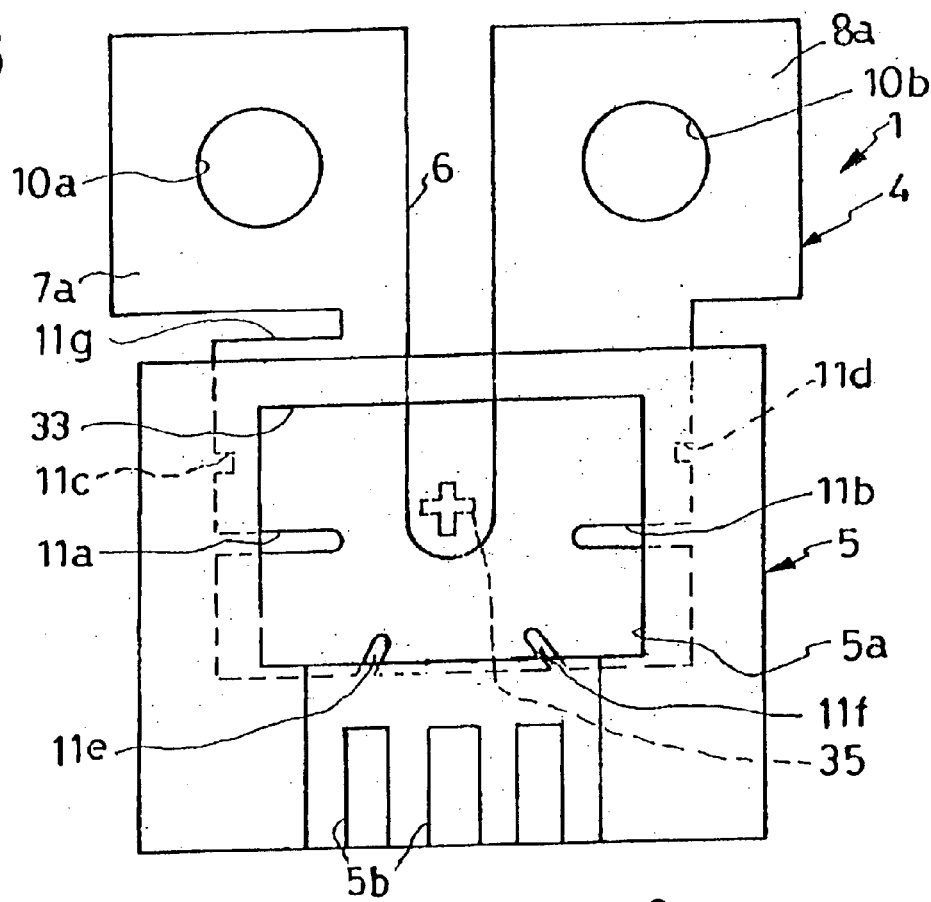
FIG. 6 is a plan view of the current-path conductor assembly shown in FIG. 5.

As best seen in FIG. 5, the encapsulation 30 of the Hall generator assembly 2 is generally box-shaped, with a size to fit in the positioning recess $5_a$ in the conductor holder 5 of the current-path conductor assembly 1. It will also be noted from this figure that the encapsulation 30 includes a bottom surface 32 held against the exposed surface portion 31 of the current-path conductor 4 of the current-path conductor assembly 1, and a side surface 34 to be held against the wall surface 33 defining the positioning recess $5_a$. The current-path conductor assembly 1 and the Hall generator assembly 2 are bonded together by the adhesive layer 3, FIG. 2, between the surface portion 31 of the current-path conductor 4, which is left exposed as aforesaid by the conductor holder 5, and the bottom surface 32 of the Hall generator encapsulation 30 and by another such layer between the wall surface 33 of the conductor holder 5 and the side surface 34 of the Hall generator encapsulation 30. Thus, as the conductor holder 5 and Hall generator encapsulation 30 are integrally joined together as above, so are the current-path conductor assembly 1 and Hall generator assembly 2, completing the current detector as in FIGS. 1–4. The conductor holder 5 and Hall generator encapsulation 30 constitute in combination a unitary casing of the current detector.

FIG. 4 clearly illustrates that the four Hall generator leads 22–25 are partly received respectively in the positioning recesses $5_b$ in the conductor holder 5 and thereby held in parallel spaced relationship to one another. The conductor holder 5 with the positioning recesses $5_b$ serves to prevent the leads 22–25 from mutual electrical contact as well as from mechanical deformation or displacement.

Figure 2:
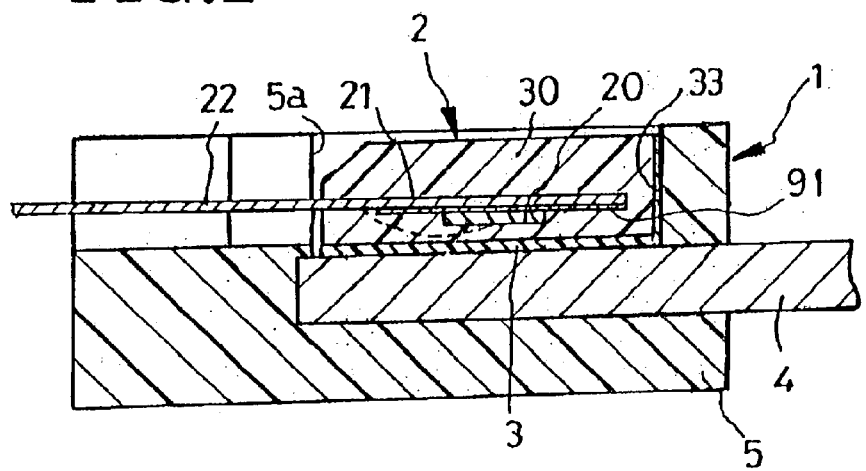
FIG. 2 is a section through the first preferred form of current detector, taken along the line II—II in FIG. 1.
Figure 3:
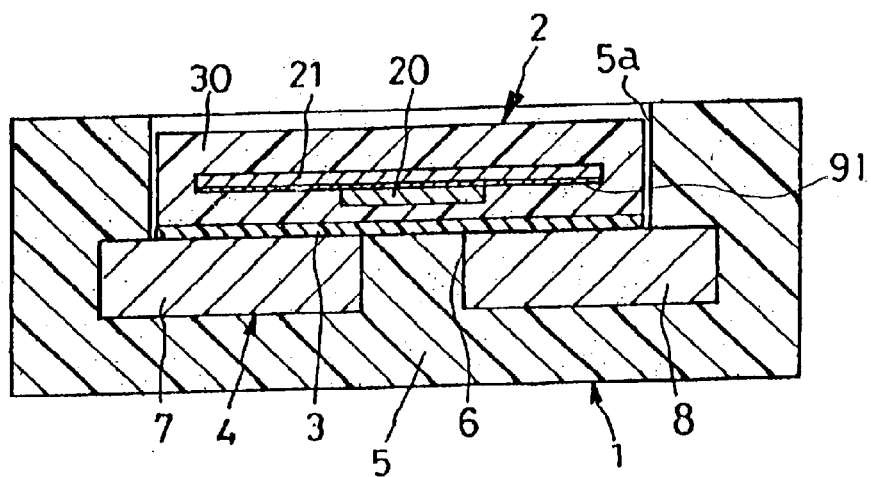
FIG. 3 is another section through the first preferred form of current detector, taken along the line III—III in FIG. 1.

It will be observed from FIGS. 2–4 that the Hall generator assembly 2 with the leads 22–25 is received with clearances in the positioning recesses $5_a$ and $5_b$ in the conductor holder 5. Although the current-path conductor assembly 1 and Hall generator assembly 2 can be firmly united solely by the adhesive layer 3, it is recommended for still stronger union of the two assemblies 1 and 2 that a suitable adhesive resin be introduced into the clearances therebetween for solidification in situ. The resin thus introduced into the clearances is shown at 90 in FIGS. 10 and 11. The reference numeral 93 in these figures generally designate the unitary casing for the current detector which is constituted of the current-path conductor holder 5, Hall generator encapsulation 30, adhesive layers 3, and additional resin layers 90.

Figure 12:
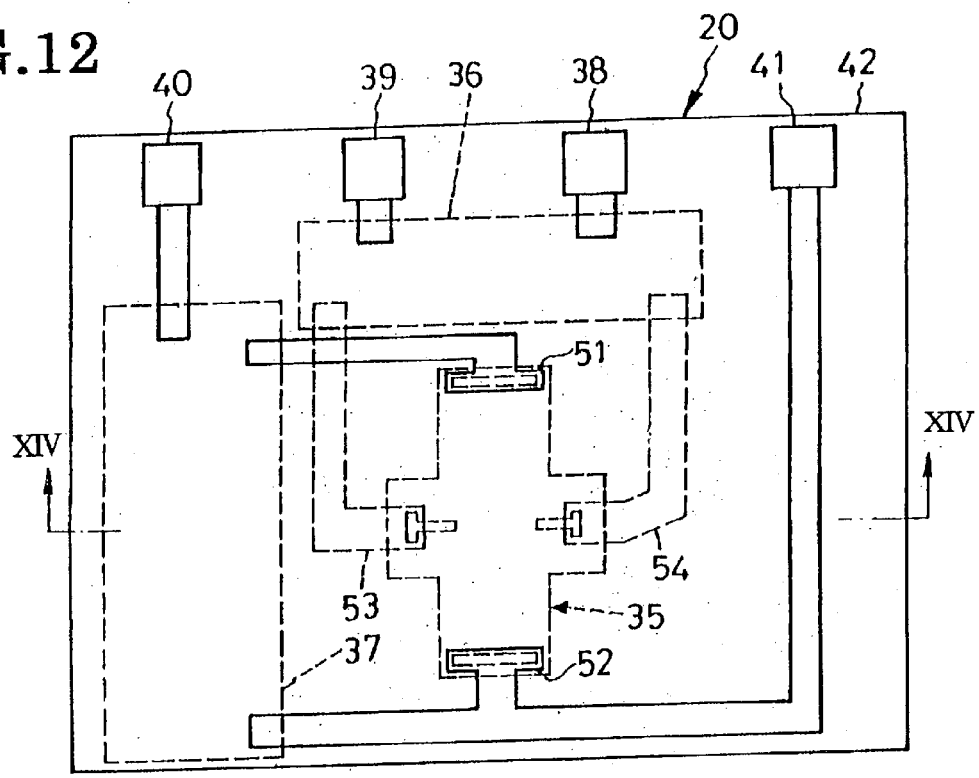
FIG. 12 is an enlarged bottom plan view of the semiconductor chip of the Hall generator assembly of FIGS. 7 and 9.

As illustrated in detail in FIG. 12, the semiconductor chip 20 comprises a Hall-effect device or Hall generator 35, an amplifier 36, and a control current supply circuit 37, which are all conventionally formed in a substrate 42 of semiconductor material (e.g. gallium arsenide or silicon). The construction of the semiconductor chip 20 is generally conventional, so that no more detailed illustration of the amplifier 36 and control current supply circuit 37 is considered necessary; only, the Hall generator 35 is shown in further detail in FIGS. 13 and 14 as it bears more or less direct pertinence to the various improvements that are introduced into this current detector by the instant invention.

Figure 13:
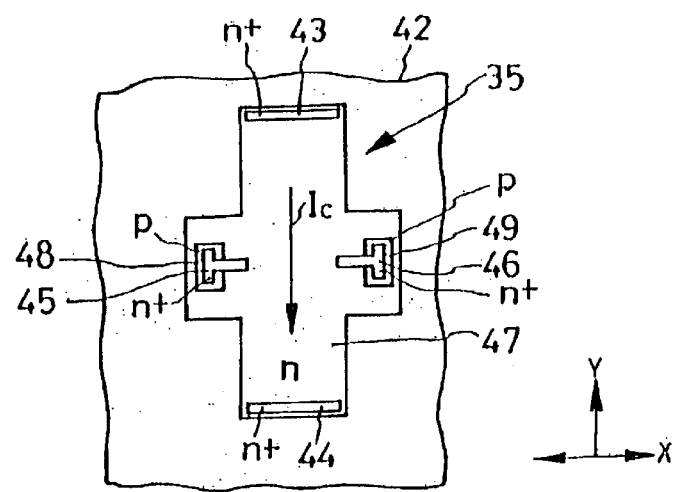
FIG. 13 is a fragmentary plan view showing in more detail the Hall generator included in the semiconductor chip of FIG. 12.
Figure 14:
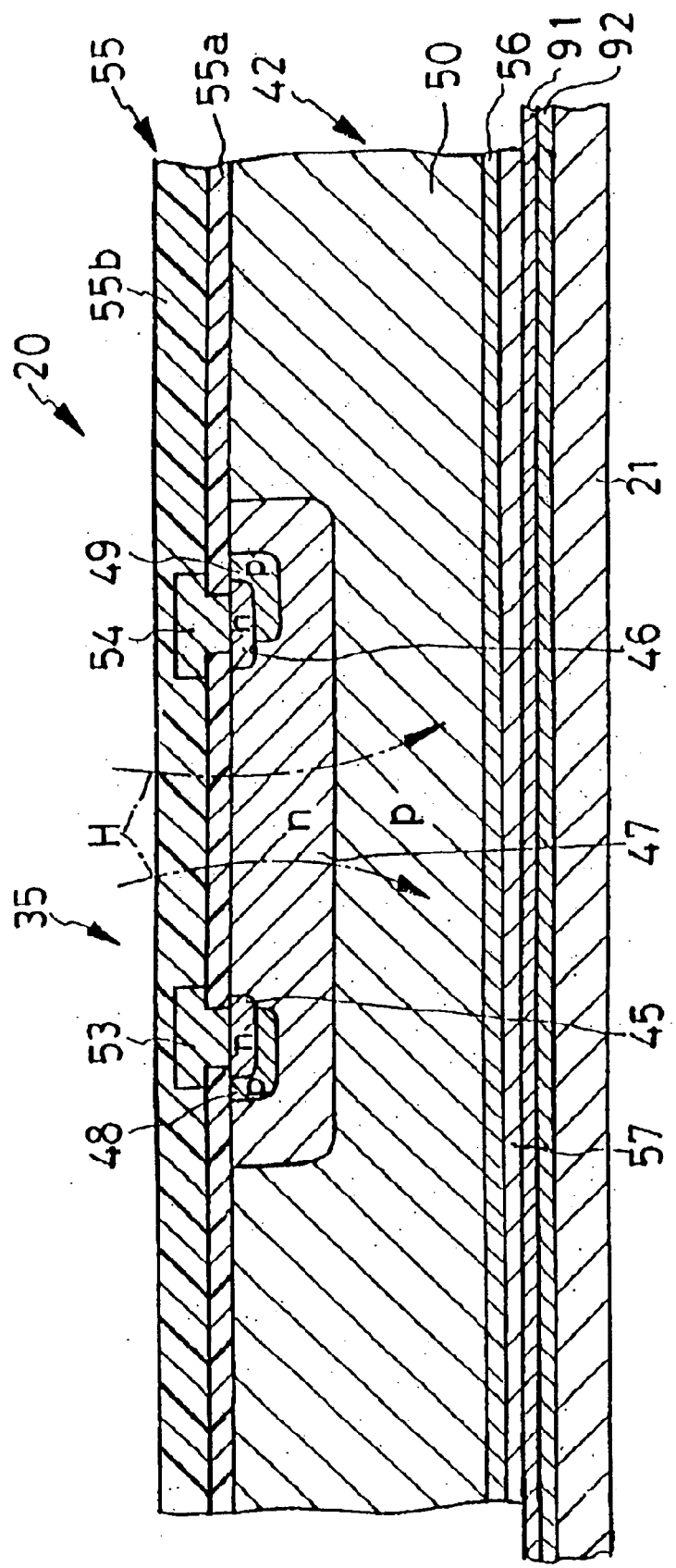
FIG. 14 is a still more enlarged, fragmentary section through the semiconductor chip including the Hall generator of FIG. 13, the section being taken along the line XIV—XIV in FIG. 12.

With reference to FIGS. 13 and 14 the Hall generator 35 is constituted of five n-type semiconductor regions 43, 44, 45, 46 and 47 and three p-type semiconductor regions 48, 49 and 50, which are all formed in the substrate 42 of square shape as seen in a plan view as in FIG. 12. The fifth n-type semiconductor region 47 is formed as an island, which is cross-shaped as seen in a plan view as in FIG. 13, in the third p-type semiconductor region 50 which occupies most part of the substrate 42. Higher in impurity concentration than this fifth n-type semiconductor region 47, the first and second n-type semiconductor regions 43 and 44 are both formed as islands in the region 47 with a spacing therebetween along the y-axis in FIG. 13. Electrodes 51 and 52, FIG. 12, are in ohmic contact respectively with the first and second n-type semiconductor regions 43 and 44. The electrodes 51 and 52 are both connected to the control current supply circuit 37 in order to cause control current $I_c$ to flow through the fifth n-type semiconductor region 47 from the first n-type semiconductor region 43 to the second 44. It is understood that the electrodes 51 and 52 are electrically connected via the control current supply circuit 37 to a pair of terminals 40 and 41, FIG. 12, thereby to be coupled to a direct current power supply, not shown.

Also higher in impurity concentration than the fifth n-type semiconductor region 47, the third and fourth n-type semiconductor regions 45 and 46 are formed adjacent the center of the fifth n-type semiconductor region 47 in the direction of the y-axis and spaced from each other in the direction of the x-axis for detection of the Hall voltage. These regions 45 and 46 are partly contiguous to the fifth n-type semiconductor region 47 and partly to the first and second p-type semiconductor regions 48 and 49. These p-type semiconductor regions 48 and 49 are intended to limit the areas of contact of the third and fourth n-type semiconductor regions 45 and 46 with the fifth n-type semiconductor region 47. Both FIGS. 12 and 14 indicate that electrodes 53 and 54 are in ohmic contact with the third and fourth n-type semiconductor regions 45 and 46. The electrodes 53 and 54 are both electrically coupled to the terminals 38 and 39 via the amplifier 36.

Figure 11:
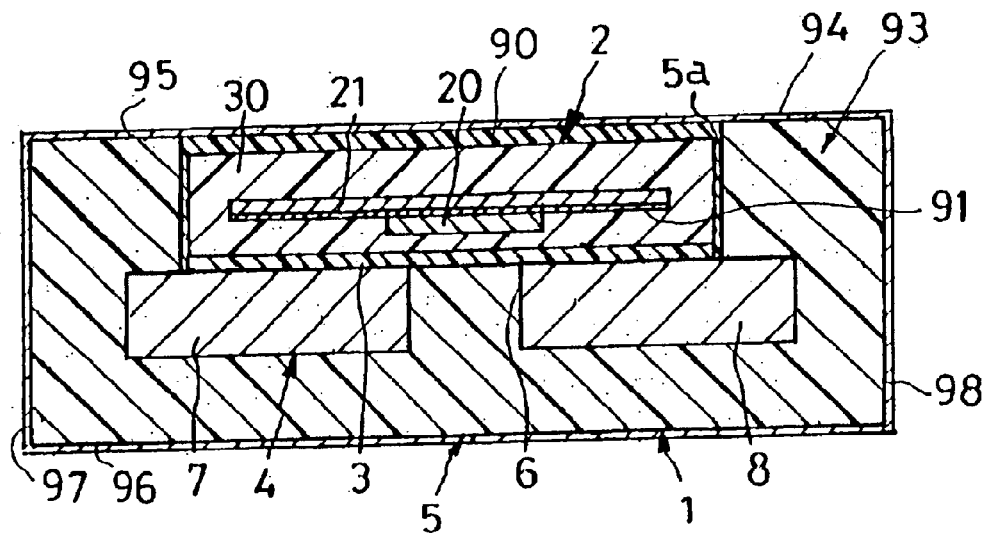
FIG. 11 is a view similar to FIG. 3 except for the showing of the additional amount of adhesive used as in FIG. 10.

A Hall voltage will develop between the third and fourth n-type semiconductor regions 45 and 46 in proportion to the strength of the magnetic field applied normal to the flow of the control current $I_c$ from the first n-type semiconductor region 43 to the second 44 as in FIG. 11. Thus the part of the fifth n-type semiconductor region 47 which lies between the first and second n-type semiconductor regions 43 and 44 and between the third and fourth n-type semiconductor regions 45 and 46 constitutes the "primary working part of the Hall generator 35," a term used in the claims appended hereto, in the narrower sense of the term. Speaking more broadly, however, this term may be construed to refer to the entire fifth n-type semiconductor region 47.

As shown also in FIG. 14, the semiconductor substrate 42 has an insulating layer 55, as of silicon oxide, formed on one major surface thereof and a metallic layer 56, as of aluminum, on the other major surface thereof. The insulating layer 55 takes the form of a lamination of two sublayers 55a and 55b for convenience in wiring. The electrodes 51 and 52, FIG. 12, are coupled to the first and second n-type semiconductor regions 43 and 44, respectively, via openings in the insulating sublayers 55a and 55b. The electrodes 53 and 54, FIG. 14, are coupled to the third and fourth n-type semiconductor regions 45 and 46, respectively, via openings in the insulating sublayer 55a. The metallic layer 56 on the other major surface of the substrate 42 is bonded at 57 to the magnetic layer 91, which in turn is bonded at 92 to the mounting plate 21 shown also in FIGS. 1–3 and so forth. The bonding agent 57 may be either electrically conductive or insulating.

Constituting a feature of this invention, the magnetic layer 91 is a layer of magnetic material, preferably a sheet of Permalloy (tradename for a series of highly magnetically permeable iron-base alloys containing approximately 35–80% nickel), with a specific magnetic permeability of 5500 and a thickness of 100 microns. An epoxy adhesive is recommended for bonding this magnetic layer 91 to the mounting plate 21. The magnetic layer 91 should be larger in area than the Hall generator 35 and, preferably than the actually current-flowing part of the current-path conductor 4. In this particular embodiment, as will be understood from FIGS. 1 and 3 for example, the magnetic layer 91 is of the same size as the mounting plate 21 which is substantively larger than the semiconductor chip 20. The adhesive layers 57 and 92 shown in FIG. 12 are not in FIGS. 2, 3, 5, 10 and 11 for simplicity. The bonding of the magnetic layer 91 to the mounting plate 21 is not a prerequisite, either; in practice, they may be united as by vaporization, deposition or pressurization.

Figure 9:
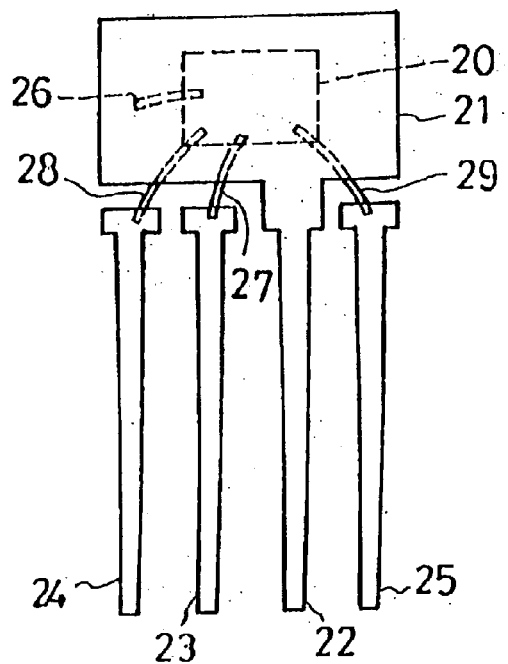
FIG. 9 is a plan view showing all but the plastic encapsulation of the Hall generator assembly of FIG. 7.

FIG. 9 best indicates that the mounting plate 21 is generally rectangular in shape, with an area greater than that of the semiconductor chip 20. The mounting plate 21 and the four leads 22–25 are punchings made from the same sheet metal material such as sheet copper with a nickel plating, and are less in thickness than the current-path conductor 4. The mounting plate 21 is joined directly to the lead 22, which usually is grounded. Additionally, the mounting plate 21 is wired at 26 to the terminal 38, FIG. 12, of the semiconductor chip 20. The other terminals 39–41 of the semiconductor chip 20 are wired at 27–29 to the leads 23–25, respectively.

As will be noted by referring back to FIGS. 1–3, the mounting plate 21 is laid parallel to the current-path conductor 4. The semiconductor chip 20 is so positioned on this mounting plate 21 that, as seen in a plan view as in FIG. 1 or in a direction normal to the parallel planes of the current-path conductor 4 and mounting plate 21, most of the semiconductor chip 20 is in register with the slit 6 between the pair of limbs 7 and 8 of the current-path conductor 4. Speaking more broadly, as indicated by the dashed lines in both FIGS. 1 and 6, at least the primary working part of the Hall generator 35 is contained in the slit 6 as seen in a plan view.

The semiconductor substrate 42 is 0.3 millimeter thick in this particular embodiment. There is a spacing of 0.38 millimeter between this semiconductor substrate 42 and the current-path conductor 4.

Referring again to FIGS. 10 and 11, the noted unitary casing 93 of this current detector is approximately box-shaped, having a pair of opposite major surfaces 95 and 96 and four side surfaces 97, 98, 99 and 100. According to a further feature of this invention, a layer of magnetic material 94 covers all of the two major surfaces 95 and 96 and two side surfaces 97 and 98, and parts of the other two side surfaces 99 and 100, of the current detector casing 93. The magnetic covering 94 leaves parts of the side surfaces 99 and 100 exposed because the Hall generator leads 22–25 and the pair of terminal portions of the current-path conductor 4 project from these surfaces. The magnetic covering 94 can also be sheets of Permalloy with a specific magnetic permeability of 5500 and a thickness of 100 microns. The Permalloy sheets may be attached to the required surfaces of the current detector casing 93 as by an epoxy adhesive.

Generally, for higher noise immunity and higher detection sensitivity, as much part as possible of all the surfaces of the current detector casing 93 should be covered with magnetic material, provided that such covering is out of contact with the current-path conductor 4 and leads 22–25. Purely for the purpose of higher sensitivity, however, a magnetic layer may be formed on at least part of the major surface 95 of the current detector casing 93 in overlying relationship to the semiconductor chip 20.

In use of this current detector, constructed as set forth hereinbefore with reference to FIGS. 1–14, the pair of terminals $7_a$ and $8_a$ of the current-path conductor 4 may be connected to the desired electric circuit so that the current to be detected or measured may flow through the U-shaped path of the conductor. Since this current path substantially encircles and closely adjoins the primary working part of the Hall generator 35, as seen in a plan view as in FIG. 1, the current flow through the conductor 4 will produce a magnetic field H, as indicated by the arrows in FIG. 14, effectively acting on the Hall generator. Oriented normal to the direction of the control current $I_c$, FIG. 13, flowing through the n-type semiconductor region 47 of the Hall generator 35, the magnetic field H will give rise to the Hall voltage between the pair of n-type semiconductor regions 45 and 46, or between the pair of electrodes 53 and 54. This Hall voltage will be in proportion with the strength of the magnetic field H and hence with the magnitude of the current to be detected.

In order to ascertain the effectiveness of the magnetic layer 91 and magnetic covering 94 proposed by this invention, there were prepared the following twelve test current detectors which were all constructed as in FIGS. 1–14 except for the presence or absence, or placement, of the magnetic layer 91 and magnetic covering 94:

Test Current Detector No. 1 had neither magnetic layer 91 nor magnetic covering 94.

Test Current Detector No. 2 had the magnetic layer 91 but no magnetic covering 94.

Test Current Detector No. 3 had no magnetic layer 91 but did have the magnetic covering 94.

Test Current Detector No. 4 had no magnetic layer 91 but did have the magnetic covering 94 only on the pair of opposite major surfaces 95 and 96 of the current detector casing 93

Test Current Detector No. 5 had no magnetic layer 91 but did have the magnetic covering 94 only on the first major surface 95 of the current detector casing 93.

Test Current Detector No. 6 had no magnetic layer 91 but did have the magnetic covering 94 only on the second major surface 96 of the current detector casing 93.

Test Current Detector No. 7 had the magnetic layer 91 formed on that surface of the Hall generator encapsulation 30 which is directed away from the current-path conductor 4, and had no magnetic covering 94.

Figure 10:
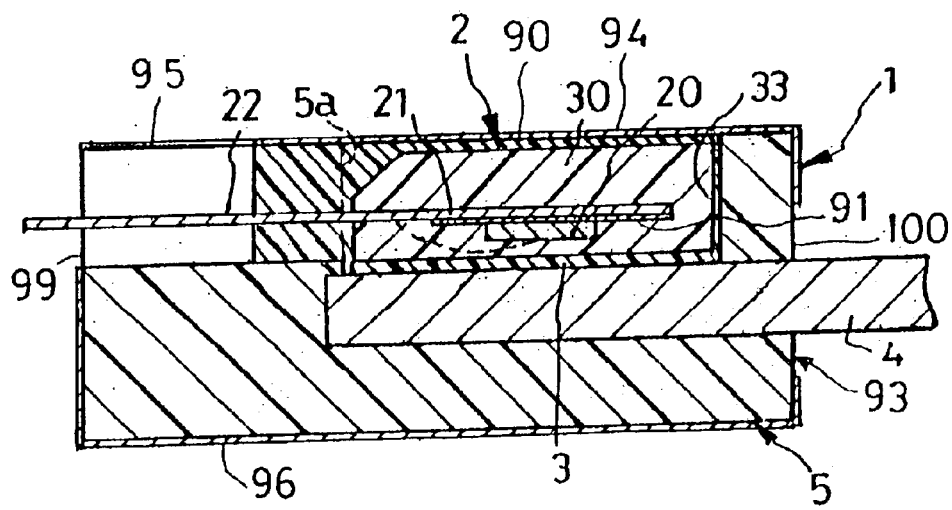
FIG. 10 is a view similar to FIG. 2 except that an additional amount of adhesive is shown used for uniting the current-path conductor assembly and the Hall generator assembly.

Test Current Detector No. 8 had the magnetic layer 91 placed as in FIGS. 10 and 11 but had the magnetic covering 94 only on the second major surface 96 of the current detector casing 93.

Test Current Detector No. 9 had no mounting plate 21, had the magnetic layer 91 place on that surface of the semiconductor chip 20 which is directed away from the current-path conductor 4, and had the magnetic covering 94 as in FIGS. 10 and 11.

Test Current Detector No. 10 had the magnetic layer 91 as in Test Current Detector No. 9, and had the magnetic covering 94 only on the second major surface 96 of the current detector casing 93.

Test Current Detector No. 11 had no mounting plate 21, had the magnetic layer 91 only on that surface of the semiconductor chip 20 which faces away from the current-path conductor 4, and had no magnetic covering 94.

Test Current Detector No. 12 had both magnetic layer 91 and magnetic covering 94 exactly as shown in FIGS. 10 and 11.

The sensitivies of the twelve Test Current Detectors were measured by causing a current of 20 amperes to flow through their current-path conductors 4. The table below lists the relative sensitivities of Test Current Detectors Nos. 1-12, with the sensitivity of Test Current Detector No. 1, which belongs to the prior art, set at 1.00 by way of reference:

| Test Current Detector No. | Sensitivity |
| --- | --- |
| 1 | 1.00 |
| 2 | 1.23 |
| 3 | 1.35 |
| 4 | 1.18 |
| 5 | 1.06 |
| 6 | 1.10 |
| 7 | 1.15 |
| 8 | 1.56 |
| 9 | 1.46 |
| 10 | 1.23 |
| 11 | 1.11 |
| 12 | 1.79 |

Test Current Detector No. 12, constructed as shown in FIGS. 10 and 11, was the highest in sensitivity, but Test Current Detectors Nos. 2–11 all indicated appreciable improvements in sensitivity. All these Test Current Detectors No. 2–12 are therefore believed to fall within the scope of this invention.

The following is a summary of the features of the FIGS. 1–14 current detector, together with the advantages accruing therefrom:

1. The current detector casing 93 covers the Hall generator 35 and the current-path conductor 4. The semiconductor chip 20 with the Hall generator 35 can thus be positioned sufficiently close to the current-path conductor 4 for high sensitivity current detection.
2. The magnetic layer 91 and magnetic covering 94 are both placed away from between current-path conductor 4 and Hall generator 35 for higher sensitivity, as the flux through the Hall generator will encounter less magnetic resistance and be prevented from unnecessarily spreading.
3. The magnetic layer 91 and magnetic covering 94 shield the Hall generator from external magnetic or electromagnetic noise.
4. With the semiconductor chip 20 positioned between current-path conductor 4 and magnetic layer 91, the magnetic resistance is effectively reduced which opposes the flux due to the current flowing through the current-path conductor, resulting in an increase in the flux actually acting on the Hall generator.
5. Upon intrusion of relatively high-frequency electromagnetic or magnetic disturbances, eddy current will flow in the mounting plate 21 for noise absorption. In cases where the disturbances are of such low frequency as to cause no eddy current flow, on the other hand, the magnetic layer 91 interposed between semiconductor chip 20 and mounting plate 21 will function as bypass, preventing the noise from reaching the Hall generator 35.
6. Mounted to the sheet-metal mounting plate 21, the semiconductor chip 20 is thereby shielded from external fields.
7. The current detector is separated into the current-path conductor assembly 1 and the Hall generator assembly 2, which are separately, and preferably concurrently, manufacturable. Moreover, for still higher production efficiency, the two assemblies 1 and 2 may be tested separately, and only those assemblies which have proved to be in good working order may be put together to complete current detectors. The thus completed current detectors will be almost all faultless since all that is required to combine the two assemblies is the bonding of the current-path conductor holder 5 and the Hall generator encapsulation 30.
8. The conductor holder 5 of the current-path conductor assembly 1 has formed therein the positioning recess $5_a$ for receiving the Hall generator assembly 2 in joining the two assemblies 1 and 2. The Hall generator 35 can thus be automatically positioned with respect to the current-path conductor 4.
9. The leads 22–25 of the Hall generator assembly 2 are also correctly positioned against the risks of short-circuiting, deformation and displacement, by being received in the positioning recesses $5_b$ in the conductor holder 5.
10. The current-path conductor 4 is U-shaped, and the fifth n-type semiconductor region 47, the primary working part, of the Hall generator 35 is contained, as seen in a direction normal to the plane of the sheet-metal current-path conductor, inside the U-shaped current path, so that the Hall generator is to be acted upon by sufficient magnetic flux for high detection sensitivity.
11. The slits $11_a$–$11_f$, FIG. 8, are cut in the current-path conductor 4 to narrow the current path around the Hall generator 35, resulting in an increase in the magnetic flux acting effectively on the Hall generator despite use of the relatively large conductor for greater heat dissipation and mechanical strength.
12. The electric circuit connected to the current-path conductor 4 is protected from overload current as the conductor is fusible at the slits $11_g$.
13. The current-path conductor assembly 1 and the Hall generator assembly 2 are compactly united one on top of the other.
14. With the current detector separated into the current-path conductor assembly 1 and Hall generator assembly 2, the mounting plate 21 and leads 22–25 can be made thinner than the current-path conductor 4, and hence cheaper than if they were of the same thickness as the conductor.
15. The current-path conductor 4 and the Hall generator 35 are compactly combined mechanically in the completed current detector, making it easy for the current detector to be positioned and connected to the circuit to be tested.
16. The pair of terminal portions $7_a$ and $8_a$ of the current-path conductor 4 and the leads 22–25 project in opposite directions from the current detector casing 100. A high voltage withstanding capability is thus assured between current-path conductor 4 and leads 22–25, contributing to the improved reliability of the current detector. It is also an advantage of this conductor-and-leads arrangement that the pair of terminal portions $7_a$ and $8_a$ are easily connectable to the circuit to be tested, possibly for the flow of large current, without interference by the leads 22–25.

Embodiment of FIGS. 15–20

Figure 15:
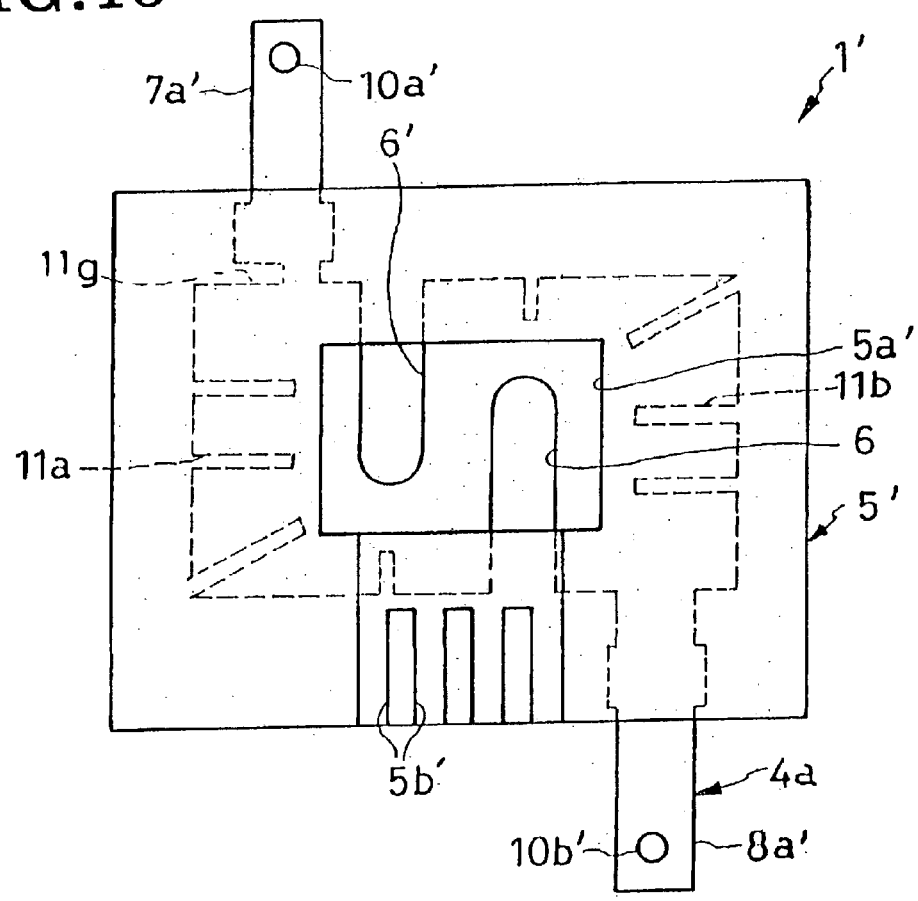
FIG. 15 is a plan view of a current-path conductor assembly of a second preferred form of current detector according to the invention which incorporates two Hall generators instead of one as in the FIGS. 1–14 current detector.
Figure 16:
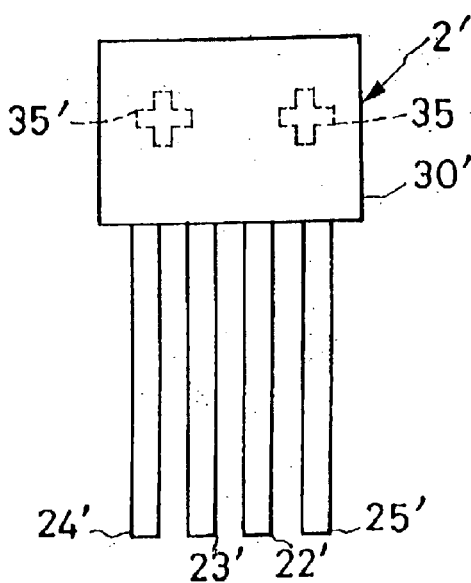
FIG. 16 is a plan view of a Hall generator assembly for use with the FIG. 15 current-path conductor assembly.

The current detector shown in these figures is a combination of a current-path conductor assembly 1', FIG. 15, and a Hall generator assembly 2', FIG. 16. The current-path conductor assembly 1' comprises a current-path conductor $4_a$, shown by itself in FIG. 17, and a conductor holder 5' of plastics material molded in one piece therewith. The Hall generator assembly 2' incorporates two Hall-effect elements or Hall generators 35 and 35' of like construction, together with a plastic encapsulation 30' for both Hall generators 35 and 35', and four leads 22', 23', 24' and 25' extending therefrom.

Figure 17:
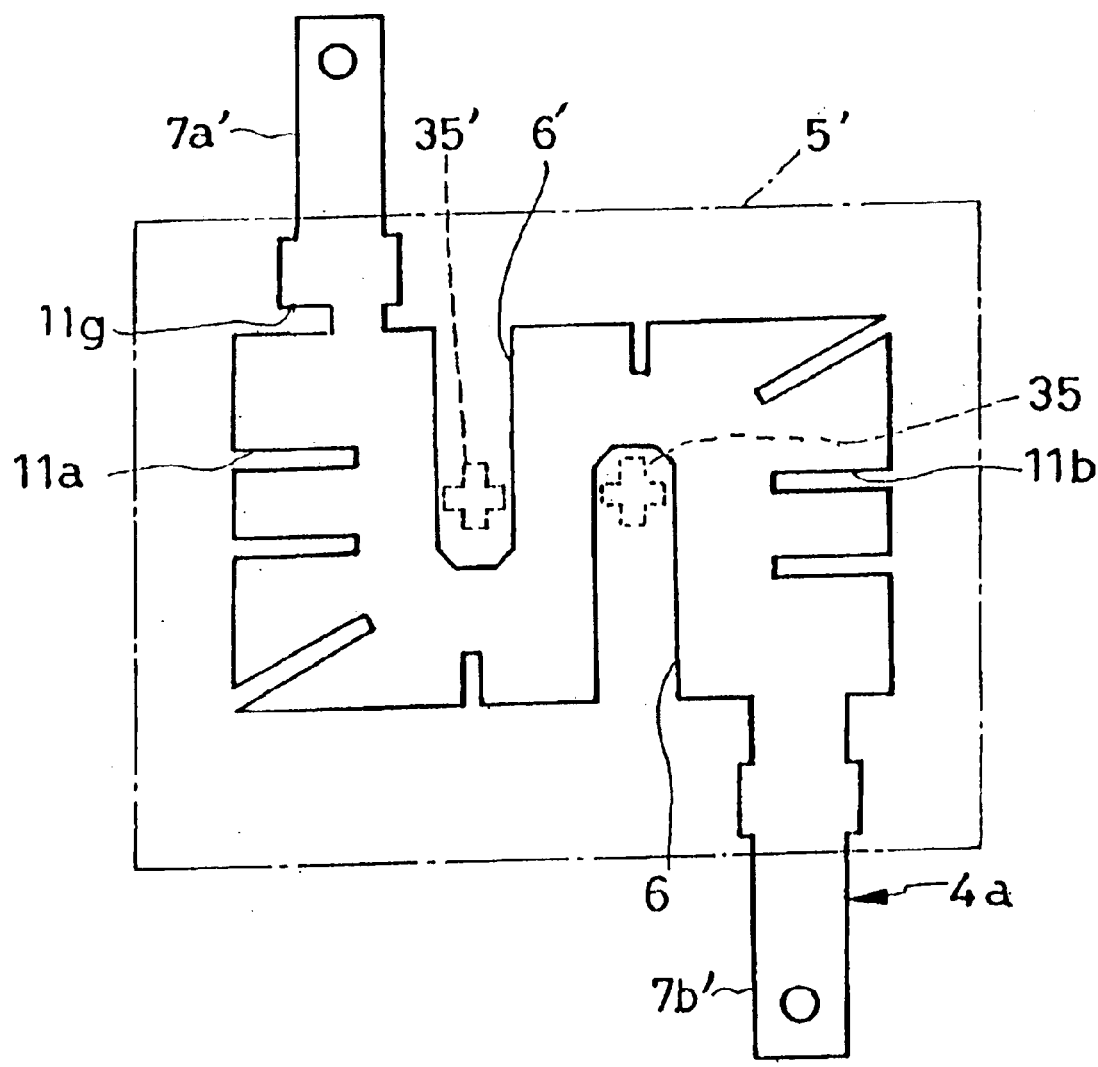
FIG. 17 is a plan view of the current-path conductor included the FIG. 15 current-path conductor assembly.
Figure 18:
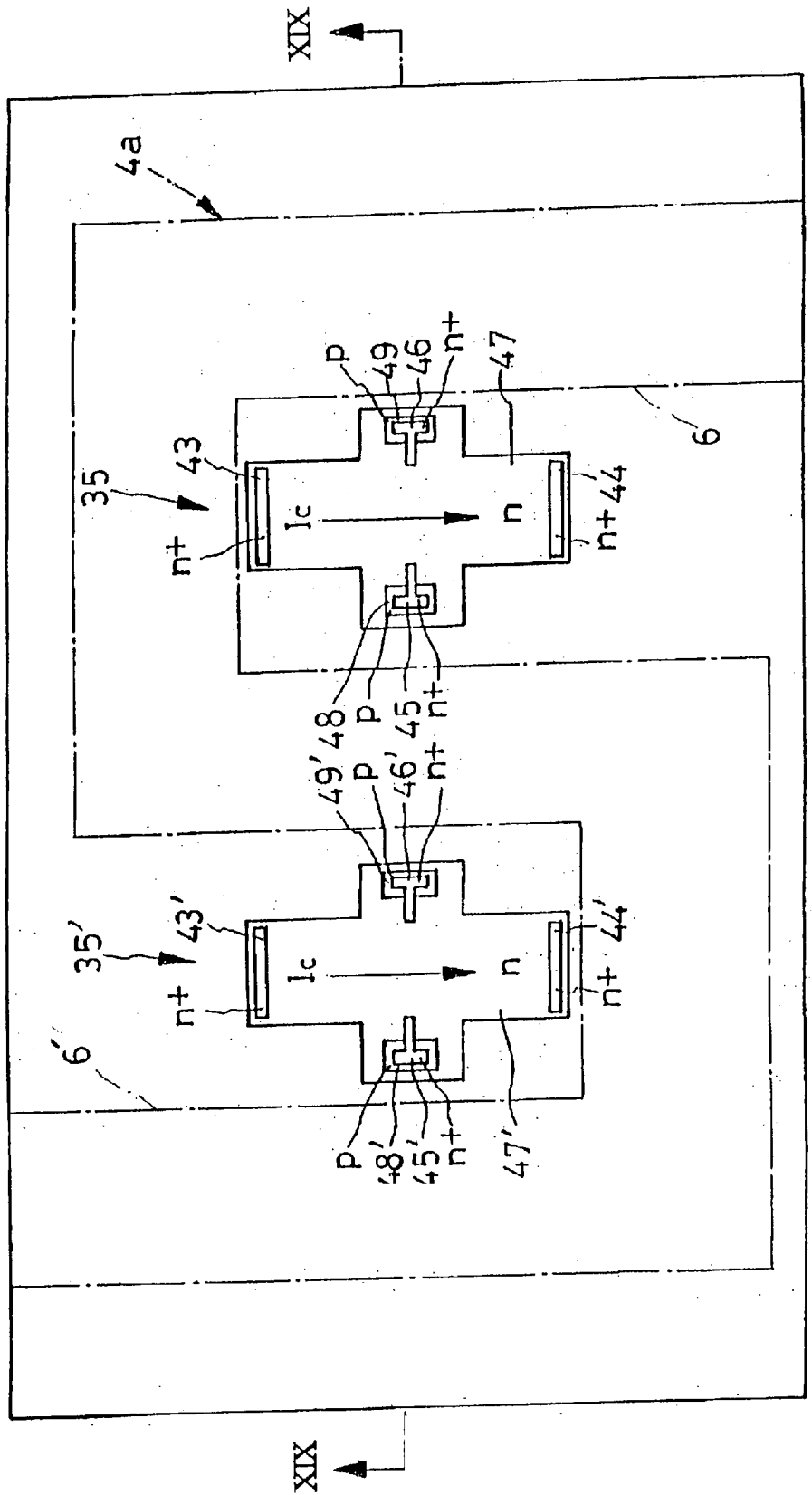
FIG. 18 is an enlarged plan view showing the two Hall generators of the FIG. 16 Hall generator assembly in relation to the S-shaped current path provided by the FIG. 17 current-path conductor.

Referring more specifically to FIG. 17, the current-path conductor $4_a$ of the current-path conductor assembly 1' is in the shape of a recumbent S, as seen in a plan view as in this figure, for use with the two Hall generators 35 and 35'. The current-path conductor $4_a$ is formed into the shape of an S by cutting two relatively wide slits or elongate openings 6 and 6' from its opposite edges in offset arrangement. The two Hall generators 35 and 35', or at least their primary working parts or fifth n-type semiconductor regions 47 and 47', are positioned in register with the slits 6 and 6' as in this figure. A plurality of, eight shown by way of example, narrower slits $11_a$ and $11_b$ are additionally cut in the current-path conductor $4_a$ from its outer edges to approximately half the width of the current path for constricting the same toward the Hall generators 35 and 35'. The current-path conductor $4_a$ has an additional slit $11_g$. This slit $11_g$ is intended to make the current-path conductor $4_a$ fusible on carrying a particular value of overload current. The current-path conductor $4_a$ terminates at both ends in a pair of terminal portions $7_a'$ and $8_a'$ extending in opposite directions therefrom for connection to an electric circuit to be tested.

Figure 19:
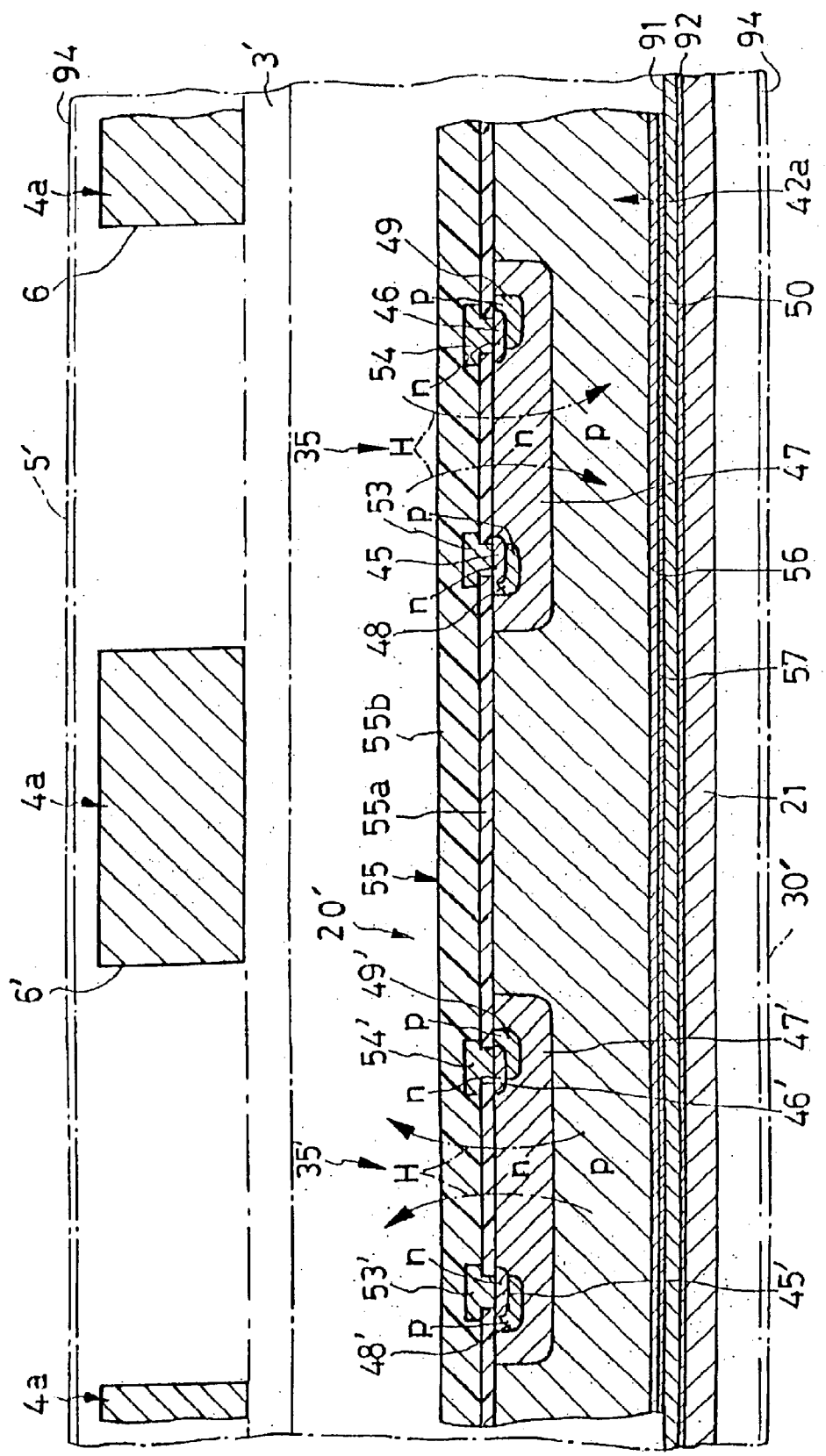
FIG. 19 is a still more enlarged, fragmentary section through the semiconductor chip including the two Hall generators of the FIG. 16 Hall generator assembly, the section being taken along the line XIX—XIX in FIG. 18.

Molded in one piece with the current-path conductor $4_a$ of the foregoing construction, the conductor holder 5' is in the shape of a six-sided solid. The pair of terminal portion $7_a'$ and $7_b'$ of the current-path conductor $4_a$ projects a pair of opposite side surfaces of the conductor holder 5'. One major surface of the conductor holder 5' has formed therein a positioning recess $5_a'$ for receiving the encapsulation 30' of the Hall generator assembly 2', and a set of elongate positioning recesses $5_b'$ for receiving parts of the leads 22'–25' of the Hall generator assembly. FIG. 19 reveals at 3' the adhesive used for bonding the conductor holder 5' and the Hall generator encapsulation 30', and at 94 the layer of magnetic material covering most of the conductor holder 5' and Hall generator encapsulation 30' which have been united as above.

As illustrated on an enlarged scale in FIG. 19, the two Hall generators 35 and 35' form parts of one and the same semiconductor chip 20' having a semiconductor substrate $42_a$, although they could be fabricated as discrete units. This semiconductor chip 20' is mounted to the metal-made mounting plate 21 via the magnetic layer 91 which is bonded at 92 to the mounting plate. A closer study of this figure will show that the two Hall generators 35 and 35' are of like construction. A comparison of FIG. 19 with FIG. 14 will further reveal that they are each of the same make as the Hall generator 35 of the FIGS. 1–14 embodiment. Thus, in FIG. 19, the various parts of the Hall generator 35 are identified by the same reference numerals as used to denote the corresponding parts of the FIG. 14 Hall generator 35, and the various parts of the other Hall generator 35' by priming the reference numerals designating their counterparts of the Hall generator 35.

As indicated by the arrows in FIG. 19, the magnetic fields H due to the current flowing through the S-shaped current-path conductor $4_a$ are opposite in direction for both Hall generators 35 and 35'.

Figure 20:
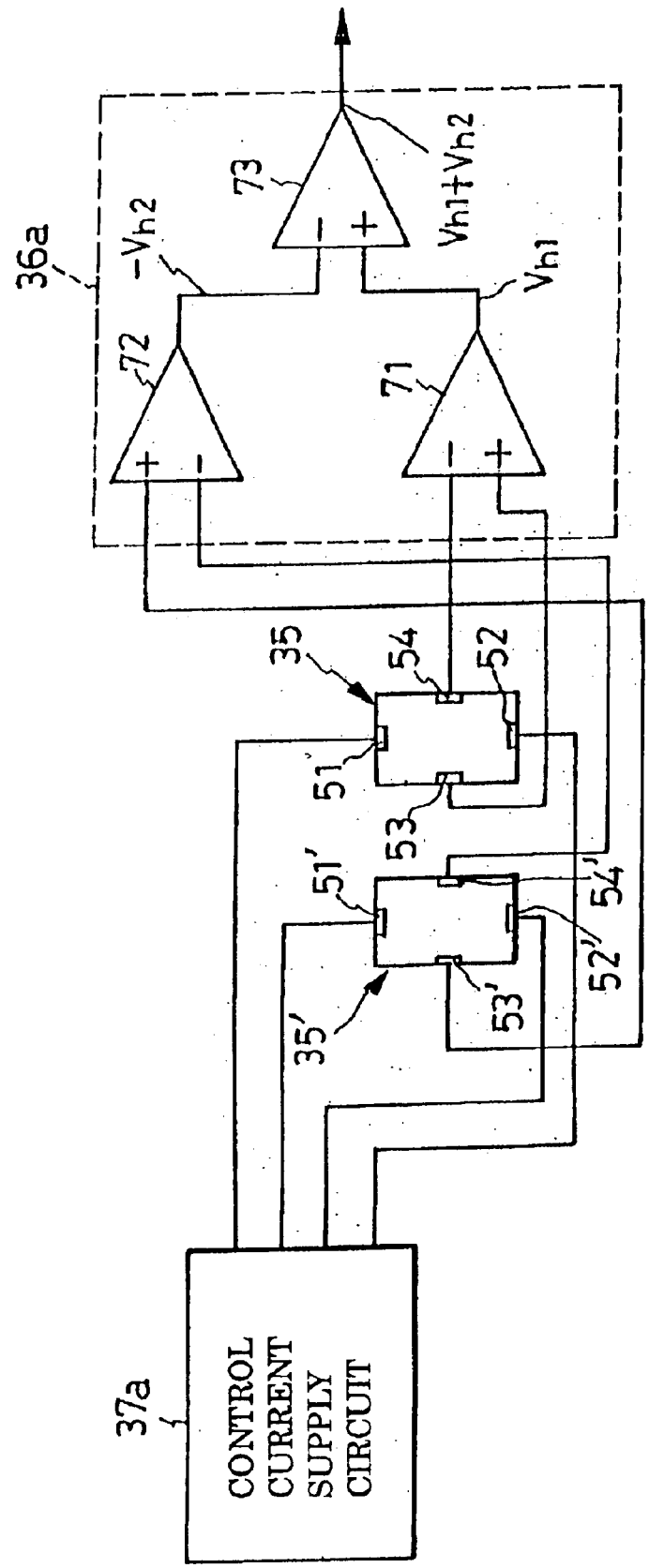
FIG. 20 is a schematic diagram of the electric circuitry of the FIGS. 15–19 current detector.

FIG. 20 shows the electrical circuitry of this current detector. The electrodes 51 and 52 of the first Hall generator 35 and the electrodes 51' and 52' of the second Hall generator 35' are all connected to the control current supply circuit $37_a$ of known design for the flow of the control current $I_c$, FIG. 18, through the Hall generators. In order to combine the output voltages of the two Hall generators 35 and 35' into a current detector output voltage indicative of the input current magnitude, there is provided an output circuit 36a comprising three differential amplifiers 71, 72 and 73. The first differential amplifier 71 has its positive input connected to the third electrode 53 of the first Hall generator 35, and its negative input to the fourth electrode 54 of the first Hall generator. The second differential amplifier 72 has its positive input connected to the third electrode 53' of the second Hall generator 35', and its negative input to the fourth electrode 54' of the second Hall generator. The Hall voltages $V_{h1}$ and $-V_{h2}$ produced by the differential amplifiers 71 and 72 are therefore opposite in polarity.

The third differential amplifier 73 of the output circuit $36_a$ has its positive input connected to the first differential amplifier 71, and its negative input to the second differential amplifier 72. The third differential amplifier 73 puts out the sum of the absolute values of the output voltages $V_{h1}$ and $-V_{h2}$ of the differential amplifiers 71 and 72 since $V_1-(-V_{h2})=V_{h1}+V_{h2}$. This output from the third differential amplifier 73 could, however, be obtained by substituting an adder therefor and providing an inverter between the second differential amplifier 72 and the adder.

The current detector of FIGS. 15–20 gains all the advantages accruing from the magnetic layer 91 and magnetic covering 94 which have been set forth in connection with the FIGS. 1–14 embodiment. Among the additional advantages peculiar to this second embodiment are:

1. The sensitivity of current detection is made even higher as the absolute values of the Hall voltages from the two Hall generators 35 and 35' are added to provide the current detector output voltage.
2. The two Hall generators 35 and 35' share the midpart of the S-shaped current-path conductor $4_a$ to keep the size of the conductor, and hence of the complete current detector, at a minimum.
3. Since the magnetic fields H acting on the two Hall generators 35 and 35' in juxtaposition are opposite in direction, the current detector output voltage is free from the effects of an external magnetic field acting on both Hall generators. Let $V_0$ be the Hall voltage due to an external magnetic field applied to each Hall generator. Then the output from the first differential amplifier 71 will be $(V_{h1}+V_0)$, and that from the second differential amplifier 72 $(-V_{h2}+V_0)$. The output from the third differential amplifier 73 will therefore be: $V_{h1}+V_0-(-V_{h2}+V_0)=V_{h1}+V_{h2}$.

Figure 21:
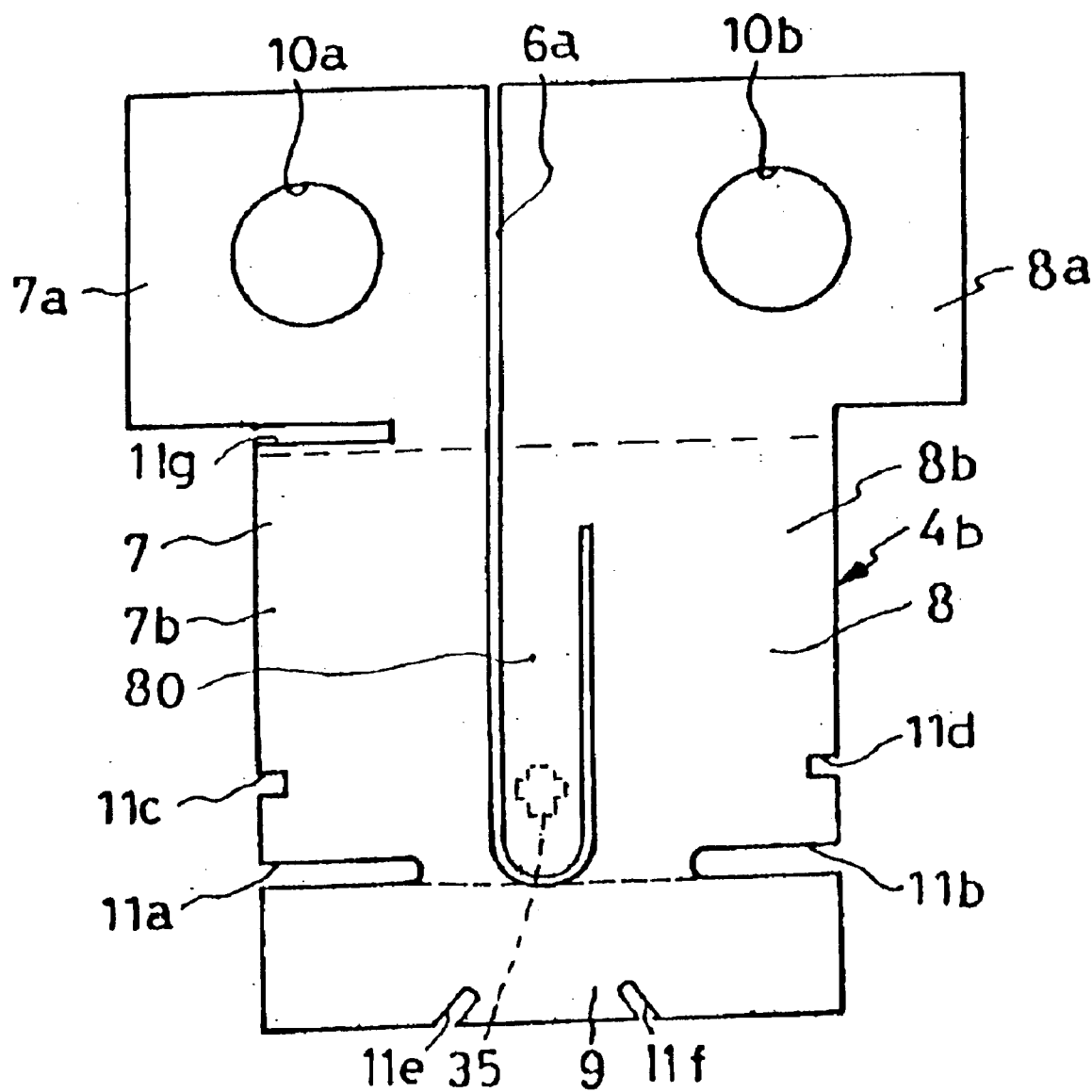
FIG. 21 is a plan view of a modified current-path conductor having a J-shaped slit.

Embodiment of FIG. 21

Another modified current-path conductor $4_b$ of FIG. 21 features a narrow, J-shaped slit $6_a$ in substitution for the broader, straight slit 6 of the FIGS. 1–14 embodiment. This modified current-path conductor $4_b$ is to be combined with the plastic conductor holder, not shown here, of the same construction as in FIGS. 1–14, and the resulting current-path conductor assembly is to be combined with the Hall-generator assembly, also not shown here, of the same construction as in FIGS. 1–14.

The current detector including the FIG. 21 current-path conductor $4_c$, has the Hall generator 35 positioned as indicated by the dashed outline in this figure. It will be noted that the Hall generator 35 is in register with that part 80 of the current-path conductor $4_b$ which is bounded by the curvature of the J-shaped slit $6_a$ therein. This part 80, absent from the FIGS. 1–14 current-path conductor 4, functions both as a shield against noise and as a heat dissipater.

Figure 22:
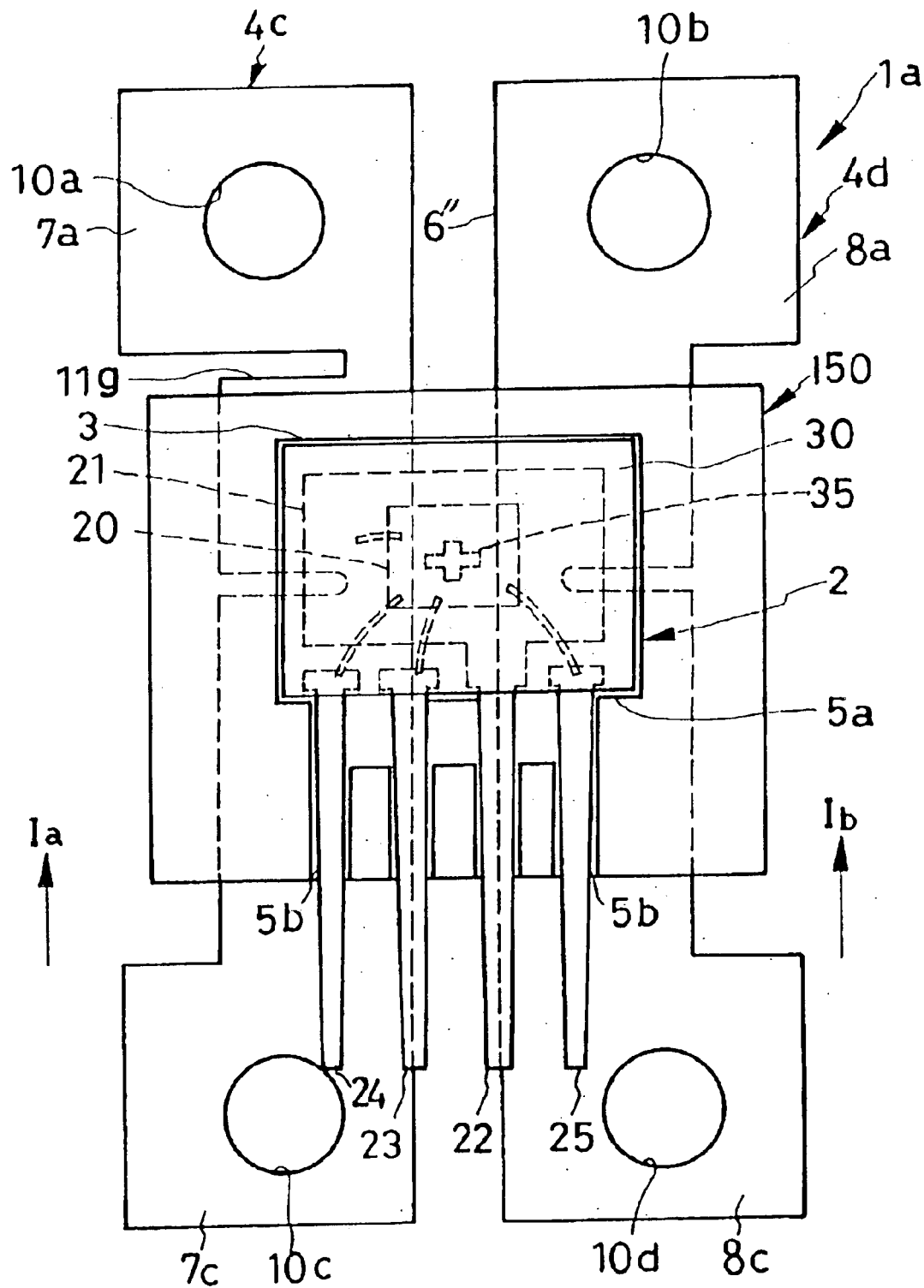
FIG. 22 is a plan view of a further preferred form of current detector according to the invention having a pair of current-path conductors instead of one as in all the foregoing embodiments.
Figure 23:
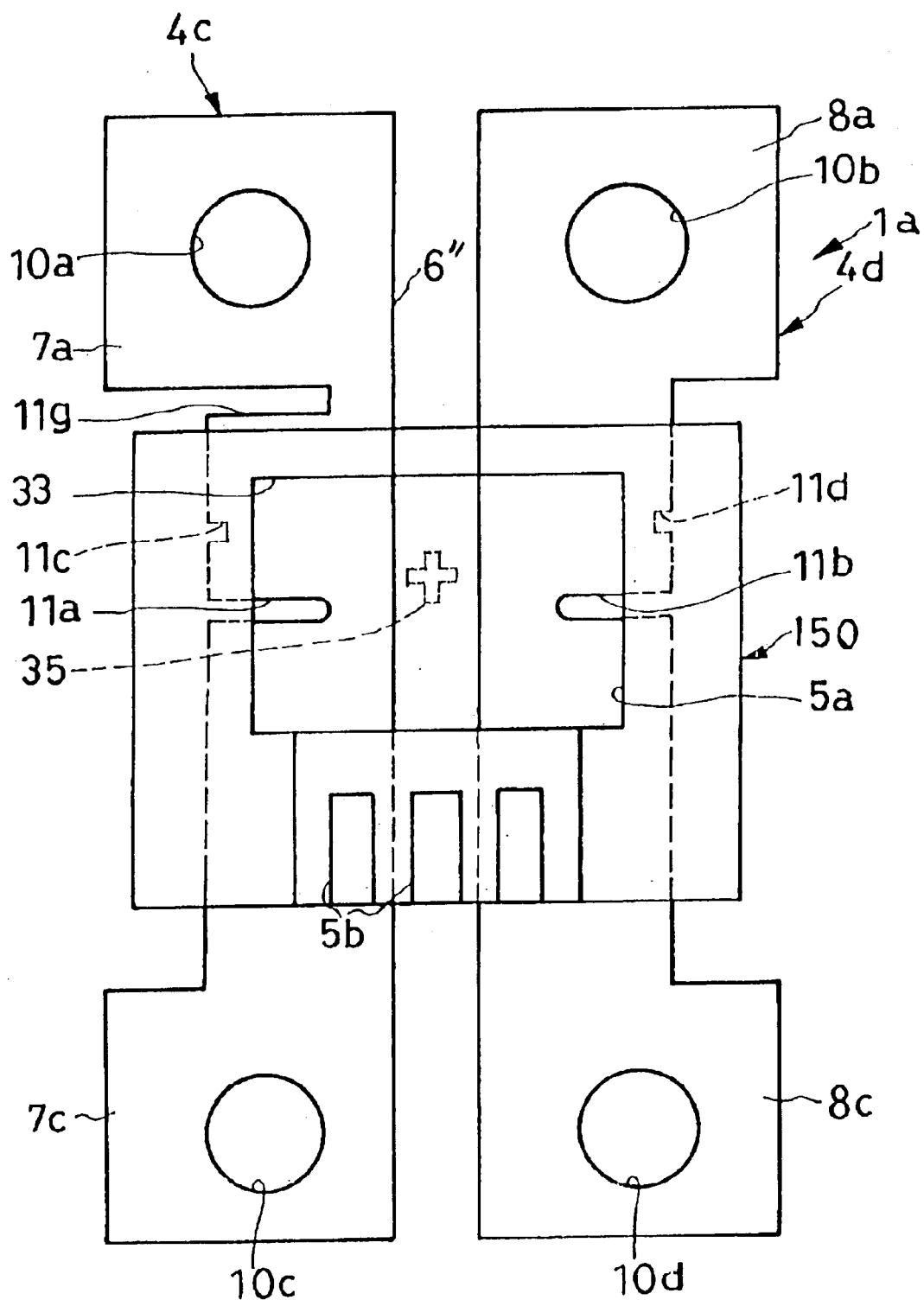
FIG. 23 is a plan view of the current-path conductor assembly of the FIG. 22 current detector.

Embodiment of FIGS. 22–23

In FIG. 22 is shown a current detector according to the invention as adapted specifically for detection of current leakage. The current leakage detector features a modified current-path conductor assembly $1_a$ which is for use in combination with the Hall generator assembly 2 of the same construction as in FIGS. 1–14.

As illustrated by itself in FIG. 23, the modified current-path conductor assembly $1_a$ includes a pair of elongate sheet-metal current-path conductors $4_c$, and $4_d$ for ease of detection of current leakage. A molded plastic conductor holder 150, another component of the current-path conductor assembly $1_b$, is formed in one piece with the current-path conductors $4_c$, and $4_d$, holding them parallel to each other with a spacing 6" therebetween which is somewhat functionally equivalent to the slit 6 in the unitary current-path conductor 4 of the FIGS. 1–14 embodiment. As indicated in phantom outline in both FIGS. 22 and 23, the Hall generator 35 of the Hall generator assembly 2 is disposed in register with this spacing 6" between the current-path conductors $4_c$, and $4_d$ as seen in a plan view as in this figure.

The pair of current-path conductors $4_c$, and $4_d$ terminate in a first pair of terminal portions $7_a$ and $8_a$, each at one end, and in a second pair of such portions $7_c$, and $8_c$ each at the other end, either for mutual interconnection or for connection to an external circuit. Connection holes $10_a$ and $10_b$ are cut in the first pair of terminal portions $7_a$ and $8_a$, and similar holes $10_c$ and $10_d$ in the second pair of terminal portions $7_c$ and $8_c$. The two pairs of terminal portions project in opposite directions from the conductor holder 150.

Generally boxlike in shape, the conductor holder 150 has formed therein the positioning recesses $5_a$ and $5_b$ for receiving the encapsulation 30 and leads 22–25, respectively, of the Hall generator assembly 2 in prescribed positional relationship to the pair of current-path conductors $4_c$, and $4_d$. It is understood that, so positioned on the conductor holder 150, the Hall generator assembly 2 is bonded to the conductor holder in the same manner as set forth in connection with FIGS. 1–14 embodiment.

In use of the FIGS. 22–23 embodiment as a current leakage detector, the pair of current-path conductors $4_c$ and $4_d$ may be serially connected respectively to the pair of power conductors, not shown, to be tested, in such a way that the currents $I_a$ and $I_b$ flow in the same direction through the conductors $4_c$ and $4_d$, as indicated by the arrows in FIG. 22. The currents $I_a$ and $I_b$ will be of the same magnitude if there is no leakage. The Hall generator 35 will produce no voltage when the currents $I_a$ and $I_b$ are of the same magnitude, since the magnetic fluxes due to the currents $I_a$ and $I_b$ act on the Hall generator in opposite directions. In event a current leakage does occur, however, the currents $I_a$ and $I_b$ will be unequal in magnitude, so that the Hall generator 35 will put out a voltage in proportion with the magnitude of the leaking current.

The FIGS. 22–23 embodiment lends itself to use as a current balance detector as well. The Hall voltage proportional to the difference between the magnitudes of two currents $I_a$ and $I_b$ to be measured will be produced as such currents are made to flow through the pair of current path conductors $4_d$ and $4_d$. Still further the FIGS. 22–23 device is readily adaptable for use in the same manner as that of FIGS. 1–14 as the pair of current-path conductors $4_c$ and $4_d$ provide the U-shaped current path as its terminal portions $7_c$ and $8_c$, for instance, are electrically interconnected. It is of course understood that this embodiment incorporates the magnetic layer 91 and magnetic covering 94 as in the FIGS. 1–14 embodiment.

Although the current detector according to the invention has been shown and described hereinbefore in terms of several preferred forms thereof, it is not desired that the present invention be limited by the exact details of the drawings or by the description thereof. The following is a brief list of possible modifications and alterations of the illustrated embodiments which are all believed to fall within the scope of this invention:

1. The semiconductor chip 20 could be mounted to that surface of the mounting plate 21 which faces away from the current-path conductor 4 or $4_a$.
2. The pair of terminal portions $7_a$ and $8_a$ of the current-path conductor 4 could be crank- or swan-shaped.
3. The leads 22–25 could also be cranked.
4. The pair of terminal portions $7_a$ and $8_a$ of the current-path conductor 4 could be adapted for welding to a desired circuit.
5. The division of the current detector into the current-path conductor assembly and Hall generator assembly is not an essential feature of the invention.

What is claimed is:

1. A current detector utilizing the Hall-effect for detection or measurement of electric current, comprising:
   (a) a current-path conductor for carrying current to be detected or measured;
   (b) a mounting plate made from a metal material;
   (c) a magnetic layer disposed on the mounting plate and bonded to the mounting plate;
   (d) a Hall generator bonded to the magnetic layer and disposed between the current-path conductor and the magnetic layer for generating a Hall voltage proportional to the strength of a magnetic field due to the current flowing through the current-path conductor; and
   (e) a casing of electrically insulating material holding the current-path conductor and the Hall generator and the magnetic layer and the mounting plate in prescribed relative positions.

2. The current detector of claim 1 further comprising a magnetic covering which covers at least part of the casing.

3. The current detector of claim 1 wherein the current-path conductor has a slit formed therein to constrict the current path.

4. A current detector utilizing the Hall-effect for detection or measurement of electric current, comprising:
   (A) a current-path conductor assembly comprising:
      (a) a current-path conductor in the form of a piece of sheet metal for carrying current to be detected or measured; and
      (b) a conductor holder of electrically insulating material integrally holding the current-path conductor;
   (B) a Hall generator assembly comprising:
      (a) a mounting plate made from metal material;
      (b) a magnetic layer disposed on the mounting plate and bonded to the mounting plate;
      (c) a Hall generator bonded to the magnetic layer and disposed between the current-path conductor and the magnetic layer for generating a Hall voltage proportional to the strength of an applied magnetic field; and
      (d) an encapsulation of electrically insulating material integrally enveloping the Hall generator mid the magnetic layer and the mounting plate; and (C) the current-path conductor assembly and the Hall generator assembly being combined by bonding together the conductor holder of the current-path conductor assembly and the encapsulation of the Hall generator assembly into a unitary easing for the current detector, with the Hall generator positioned close to the current-path conductor in order to generate the Hall voltage in response to a magnetic field due to the current flowing through the current-path conductor.

5. The current detector of claim 4 further comprising a covering of magnetic material enveloping at least part of the casing.

6. The current detector of claim 4 wherein the current-path conductor is a piece of sheet metal having a slit formed therein to provide a U-shaped current path around the Hall generator, and wherein the Hall generator has a primary working part contained in the slit in the current-path conductor as seen in a direction normal to the plane of the sheet-metal current-path conductor.

7. The current detector of claim 6 wherein the current-path conductor has a slit formed therein to constrict the current path.

* * * * *

UNITED STATES PATENT AND TRADEMARK OFFICE
CERTIFICATE OF CORRECTION

PATENT NO. : 6,759,841 B2
DATED : July 6, 2004
INVENTOR(S) : Hirokazu Goto et al.

It is certified that error appears in the above-identified patent and that said Letters Patent is hereby corrected as shown below:

Column 3,
Line 7, delete "included" and insert -- including -- therefor;

Column 4,
Line 6, delete "11$_c$," and insert -- 11$_c$ -- therefor;

Column 8,
Line 39, insert -- . -- after "93";

Column 12,
Line 6, delete "36a" and insert -- 36$_a$ -- therefor;
Lines 21-22, delete "$V_1$-(-$V_{h2}$)=$V_{h1}$+$V_{h2}$" and insert -- $V_{h1}$-(-$V_{h2}$)=$V_{h1}$+$V_{h2}$ -- therefor;

Column 13,
Lines 15, 19, 25, 27 and 40, delete "4$_c$," and insert -- 4$_c$ -- therefor;
Line 29, delete "7$_c$," and insert -- 7$_c$ -- therefor;
Line 65, delete "4$_d$" and insert -- 4$_c$ -- therefor;

Column 14,
Line 66, delete "mid" and insert -- and -- therefor.

Signed and Sealed this

Eleventh Day of January, 2005

JON W. DUDAS
*Director of the United States Patent and Trademark Office*